US012641898B2

(12) United States Patent
Miyata et al.

(10) Patent No.: US 12,641,898 B2
(45) Date of Patent: May 26, 2026

(54) IMAGE SENSOR AND IMAGING DEVICE

(71) Applicant: NTT, Inc., Tokyo (JP)

(72) Inventors: Masashi Miyata, Musashino (JP);
Naru Nemoto, Musashino (JP);
Mitsumasa Nakajima, Musashino (JP);
Toshikazu Hashimoto, Musashino (JP)

(73) Assignee: NTT, Inc., Tokyo (JP)

( * ) Notice: Subject to any disclaimer, the term of this patent is extended or adjusted under 35 U.S.C. 154(b) by 452 days.

(21) Appl. No.: 18/031,158

(22) PCT Filed: Oct. 12, 2020

(86) PCT No.: PCT/JP2020/038500
§ 371 (c)(1),
(2) Date: Apr. 11, 2023

(87) PCT Pub. No.: WO2022/079766
PCT Pub. Date: Apr. 21, 2022

(65) Prior Publication Data
US 2023/0378210 A1 Nov. 23, 2023

(51) Int. Cl.
*H10F 39/00* (2025.01)
*G02B 3/08* (2006.01)

(52) U.S. Cl.
CPC ............. *H10F 39/806* (2025.01); *G02B 3/08* (2013.01)

(58) Field of Classification Search
None
See application file for complete search history.

(56) References Cited

U.S. PATENT DOCUMENTS

| | | | |
|---|---|---|---|
| 7,667,286 B2 | 2/2010 | Toshikiyo et al. | |
| 2008/0272454 A1 | 11/2008 | Toshikiyo et al. | |
| 2020/0249429 A1* | 8/2020 | Han | G02B 5/188 |
| 2021/0125301 A1* | 4/2021 | Park | G06T 1/0007 |
| 2021/0333151 A1 | 10/2021 | Miyata et al. | |

FOREIGN PATENT DOCUMENTS

| | | |
|---|---|---|
| CN | 1993634 A | 7/2007 |
| JP | 2009157390 | 7/2009 |
| JP | 2010212625 | 9/2010 |
| JP | 2011040441 | 2/2011 |
| WO | WO 2020066738 | 4/2020 |

OTHER PUBLICATIONS

Onozawa et al., "A MOS Image Sensor with a Digital-Microlens," IEEE Transactions on Electron Devices, Apr. 2008, 55(4):986-991.

* cited by examiner

*Primary Examiner* — Nilufa Rahim
(74) *Attorney, Agent, or Firm* — Fish & Richardson P.C.

(57) ABSTRACT

An imaging element, includes a pixel array in which a plurality of pixels including photoelectric conversion elements are arranged in a two-dimensional array, and an optical element array in which optical elements composed of a plurality of columnar structure bodies arranged opposite to a pixel array and guiding incident light to a corresponding photoelectric conversion element are arranged in a two-dimensional array, wherein the plurality of columnar structure bodies are formed in a width having a phase characteristic for guiding light to a photoelectric conversion element directly below a columnar structure body in accordance with an incident angle of the incident light of each columnar structure body when viewed in a plan view and are formed at a same height when viewed in a side view.

15 Claims, 24 Drawing Sheets

Fig. 6

| PRINCIPLE OF PHASE CONTROL | STRUCTURE MATERIALS-SURROUNDING MATERIALS | MINIMUM STRUCTURE HEIGHT @WAVELENGTH 635 nm | MAXIMUM ASPECT RATIO (MINIMUM STRUCTURE WIDTH 100 nm) |
|---|---|---|---|
| EFFECTIVE MEDIUM APPROXIMATION (TECHNIQUE IN RELATED ART) | $SiO_2(n=1.45)$−Air | 1411 nm | 14.11 |
| DIELECTRIC METAL LENS (EMBODIMENT) | $SiN(n=2.05)$−Air | 605 nm | 6.05 |
| | $TiO_2(n=2.4)$−Air | 454 nm | 4.54 |

DEFINITION OF INCIDENT ANGLE (1)

(2)

(1)

(2)

(1)

(2)

(1)

STRUCTURE OF LENS
(OPTIMAL SETTING FOR $\lambda$ =520 nm, $\theta$ =0° , AND $\Phi$ =0° )

(2)

WHEN PARALLEL LIGHT OF $\theta$ =0° AND $\Phi$ =0° IS INCIDENT
( $\lambda$ =450 nm)

(3)

(1)

STRUCTURE OF LENS
(OPTIMAL SETTING FOR $\lambda$ =520 nm, $\theta$ =0°, AND $\Phi$ =0° )

(2)

WHEN PARALLEL LIGHT OF $\theta$ =0° AND $\Phi$ =0° IS INCIDENT
($\lambda$ =520 nm)

(3)

(1)

STRUCTURE OF LENS
(OPTIMAL SETTING FOR $\lambda$ =520 nm, $\theta$ =0° , AND $\Phi$ =0° )

(2)

WHEN PARALLEL LIGHT OF $\theta$ =0° AND $\Phi$ =0° IS INCIDENT
($\lambda$ =635 nm)

(3)

(1)

STRUCTURE OF LENS
(OPTIMAL SETTING FOR $\lambda$ =520 nm, $\theta$ =0° , AND $\Phi$=0° )

(2)

WHEN PARALLEL LIGHT OF $\theta$ =15° AND $\Phi$=0° IS INCIDENT
($\lambda$ =520 nm)

(3)

(1)

STRUCTURE OF LENS
(OPTIMAL SETTING FOR $\lambda$ =520 nm, $\theta$ =0° , AND $\Phi$ =0° )

(2)

WHEN PARALLEL LIGHT OF $\theta$ =30° AND $\Phi$ =0° IS INCIDENT
( $\lambda$ =520 nm)

(3)

(1)

STRUCTURE OF LENS
(OPTIMAL SETTING FOR $\lambda$ =520 nm, $\theta$ =0°, AND $\Phi$=0° )

(2)

WHEN PARALLEL LIGHT OF $\theta$ =45° AND $\Phi$=0° IS INCIDENT
( $\lambda$ =520 nm)

(3)

STRUCTURE OF LENS
(OPTIMAL SETTING FOR $\lambda$ =520 nm, $\theta$ =0° , AND $\Phi$ =0° )

(1)

WHEN PARALLEL LIGHT OF $\theta$ =15° AND $\Phi$ =45° IS INCIDENT
($\lambda$ =520 nm)

(2)

(3)

(1)

STRUCTURE OF LENS
(OPTIMAL SETTING FOR $\lambda$ =520 nm, $\theta$ =0° , AND $\Phi$ =0° )

(2)

WHEN PARALLEL LIGHT OF $\theta$ =30° AND $\Phi$ =45° IS INCIDENT
($\lambda$ =520 nm)

(3)

(1)

STRUCTURE OF LENS
(OPTIMAL SETTING FOR $\lambda$ =520 nm, $\theta$ =0° , AND $\Phi$ =0° )

WHEN PARALLEL LIGHT OF $\theta$ =45°  AND $\Phi$ =45°  IS INCIDENT
( $\lambda$ =520 nm)

(2)

(3)

IMAGE SENSOR AND IMAGING DEVICE

CROSS-REFERENCE TO RELATED APPLICATIONS

This application is a National Stage application under 35 U.S.C. § 371 of International Application No. PCT/JP2020/038500, having an International Filing Date of Oct. 12, 2020.

The disclosure of the prior application is considered part of the disclosure of this application, and is incorporated by reference in its entirety into this application.

TECHNICAL FIELD

The present invention relates to an imaging element and an imaging device.

BACKGROUND ART

General imaging devices acquire two-dimensional images composed of light intensity information and color information from an imaged target using lens optical systems and two-dimensional image sensors such as charge coupled device (CCD) sensors or complementary metal oxide semiconductor (CMOS) sensors.

Here, an incident angle of light incident on an imaging sensor from a lens optical system is different between a central portion and an outer circumferential portion. However, since it is difficult to manufacture a lens optimized for oblique incident light required in a circumferential portion of a sensor, there is a problem that light receiving efficiency is limited.

As a lens in which such a problem is solved, a micro-structured lens using effective medium approximation is proposed (for example, refer to NPL 1). NPL 1 describes an approximation in which an effective refractive index of a micro-structured lens can be expressed by an approximately average value between a refractive index of a lens and a refractive index of a surrounding material when the micro-structured lens is very small compared to a wavelength.

CITATION LIST

Non Patent Literature

[NPL 1] Kazutoshi Onozawa, Kimiaki Toshikiyo, Takanori Yogo, Motonori Ishii, Kazuhiko Yamanaka, Toshinobu Matsuno, and Daisuke Ueda, "A MOS Image Sensor With a Digital-Microlens", IEEE transactions on electron devices, VOL. 55, No. 4, 986 to 991 (2008).

SUMMARY OF INVENTION

Technical Problem

However, in a micro-structured lens using effective medium approximation, light is confined inside the structure and excites an optical waveguide mode and a resonance mode when a large difference occurs between a refractive index of the lens and a refractive index of the surroundings and a size of the lens is of about a sub-wavelength. Thus, this approximation is no longer applicable. Therefore, the micro-structured lens described in NPL 1 is limited to a combination of materials having a small difference in refractive index, in which a material is $SiO_2$ and the surrounding material is air or the like. Thus, there is a problem that an aspect ratio of a fine structure lens becomes large and there is a polarization dependence. Furthermore, the micro-structured lens described in NPL 1 has a problem that it is difficult to manufacture because of the structure having curves and steps.

The present invention was made in view of the above description, and an object of the present invention is to provide an imaging element and an imaging device having a low aspect ratio and a simple configuration and capable of realizing lens characteristics corresponding to a main incident angle for each pixel.

Solution to Problem

In order to solve the above-described problems and achieve the purpose, an imaging element according to the present invention includes: a pixel array in which a plurality of pixels including photoelectric conversion elements are arranged in a two-dimensional array; and an optical element array in which optical elements composed of a plurality of columnar structure bodies arranged opposite to a pixel array and guiding incident light to a corresponding photoelectric conversion element are arranged in a two-dimensional array, in which the plurality of columnar structure bodies are formed in a width having a phase characteristic for guiding light to a photoelectric conversion element directly below a columnar structure body in accordance with an incident angle of the incident light of each columnar structure body when viewed in a plan view and are formed at a same height when viewed in a side view.

Also, an imaging element according to the present invention includes: a pixel array in which a plurality of pixels including photoelectric conversion elements are arranged in a two-dimensional array; and an optical element array in which optical elements composed of a plurality of columnar structure bodies arranged opposite to a pixel array and guiding incident light to a corresponding photoelectric conversion element are arranged in a two-dimensional array, in which the plurality of columnar structure bodies have a refractive index so that they have a phase characteristic for guiding light to the photoelectric conversion element directly below a columnar structure body in accordance with an incident angle of the incident light of each columnar structure body and are formed at a same height when viewed in a side view.

Furthermore, an imaging device according to the present invention includes: the above-described imaging element and a signal processing unit configured to process an electric signal output using the imaging element and generate an image.

Advantageous Effects of Invention

According to the present invention, it is possible to provide an imaging element and an imaging device including an optical element having a lower aspect ratio and a simpler configuration than in the related art and capable of realizing lens characteristics corresponding to a main incident angle for each pixel.

BRIEF DESCRIPTION OF DRAWINGS

FIG. 6 is a diagram showing a minimum structural height and a maximum aspect ratio of a medium-sized approximate structure body in the related art and a columnar structure body in the embodiment.

DESCRIPTION OF EMBODIMENTS

Figure 1:
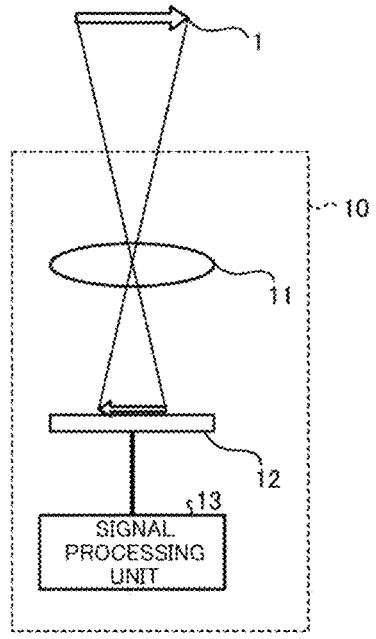
FIG. 1 is a side view showing a schematic configuration of an imaging device according to an embodiment.

The best mode for carrying out the present invention will be described in detail below with reference to the drawings. Note that, in the following description, each drawing merely schematically shows shapes, sizes, and positional relationships to the extent that the content of the present invention can be understood. Therefore, the present invention is not limited to the shapes, sizes, and positional relationships exemplified in each drawing. Furthermore, in the description provided with reference to the drawings, the same constituent elements are denoted by the same reference numerals.

[Embodiment] [Imaging Device] First, an imaging device according to an embodiment of the present invention will be described FIG. 1 is a side view showing a schematic configuration of the imaging device according to the embodiment.

An imaging device 10 according to the embodiment includes a lens optical system 11, an imaging element 12, and a signal processing unit 13 as shown in FIG. 1. The imaging element 12 has a photoelectric conversion element such as a CCD or a CMOS. The signal processing unit 13 processes a photoelectric conversion signal output from the imaging element 12 to generate an image signal.

Light such as natural light or illumination light is applied to an object 1 and light transmitted/reflected/scattered by the object 1 or light emitted from the object 1 forms an optical image on the imaging element 12 using the lens optical system 11. Generally, although the lens optical system 11 is composed of a lens group composed of a plurality of lenses arranged along an optical axis to correct various optical aberrations, in FIG. 1, the drawing is simplified and the lens optical system is shown as a single lens. The signal processing unit 13 has an image signal output for transmitting the generated image signal to the outside.

Note that, although the imaging device 10 may include known constituent elements such as an infrared light-cutting optical filter, an electronic shutter, a viewfinder, a power supply (battery), and a flashlight, the explanations thereof are omitted because they are not particularly necessary for understanding the present invention. Furthermore, the above configuration is merely an example, and in the embodiment, known elements can be appropriately combined and used as the constituent elements excluding the lens optical system 11, the imaging element 12, and the signal processing unit 13.

Figure 2:
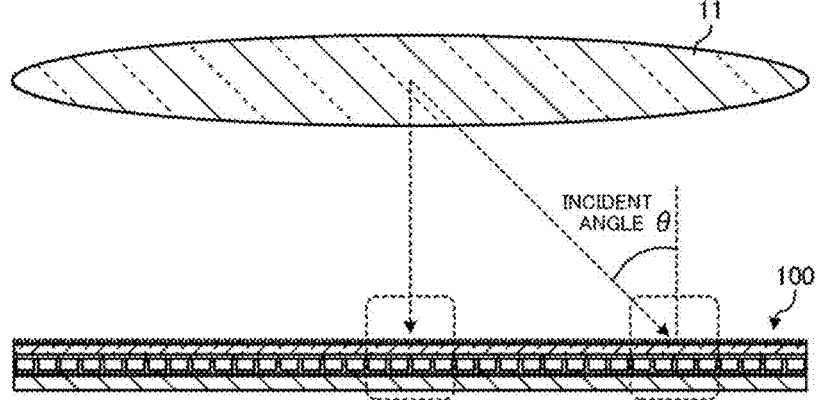
FIG. 2 is a diagram schematically showing a part of a cross section of a pixel array and a polarization wavelength separation lens array of an imaging element according to the embodiment.

[Imaging Element] An outline of the imaging element 12 according to the embodiment will be described below. FIG. 2 is a diagram schematically showing a cross section of a main part of the lens optical system 11 and the imaging element 12 according to the embodiment. In FIG. 2 and the drawings subsequent to FIG. 2, a part of the imaging element 12 will be described as an imaging element 100. The imaging element 100 has an optical element array having an optical element composed of a plurality of columnar structure bodies for guiding incident light to a photoelectric conversion element of a pixel array formed on the entire surface of a color filter. Furthermore, in the imaging element 100, as shown in FIG. 2, an incident angle θ of light incident on the imaging element 100 from the lens optical system 11 differs between a central portion and an outer circumferential portion. Thus, a plurality of columnar structure bodies formed in the optical element array are set to have a size in which a phase characteristic for guiding light to the photoelectric conversion element directly below the columnar structure body in accordance with an incident angle of the incident light is provided. A structure of the imaging element 100 will be described below with reference to FIGS. 3 to 5.

Figure 3:
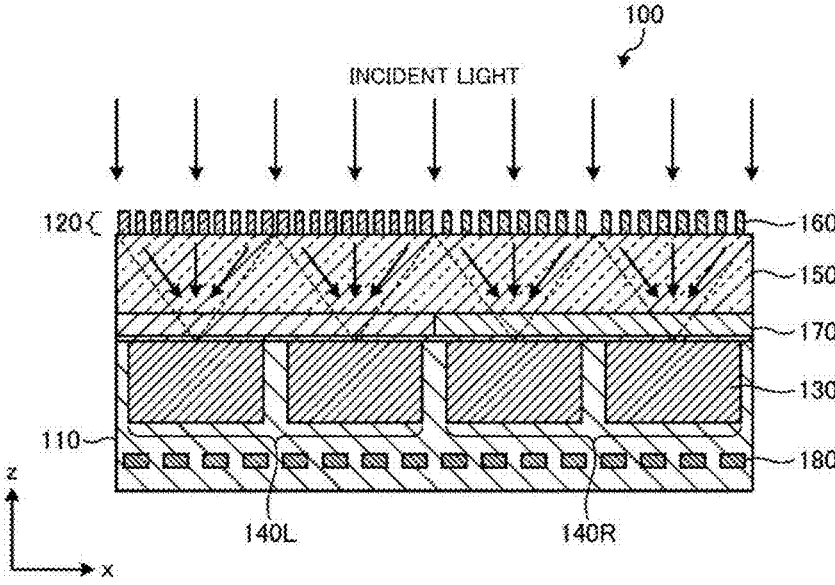
FIG. 3 is a diagram schematically showing a part of a cross section of a pixel array and an optical element array in a central portion of the imaging element according to the embodiment.
Figure 4:
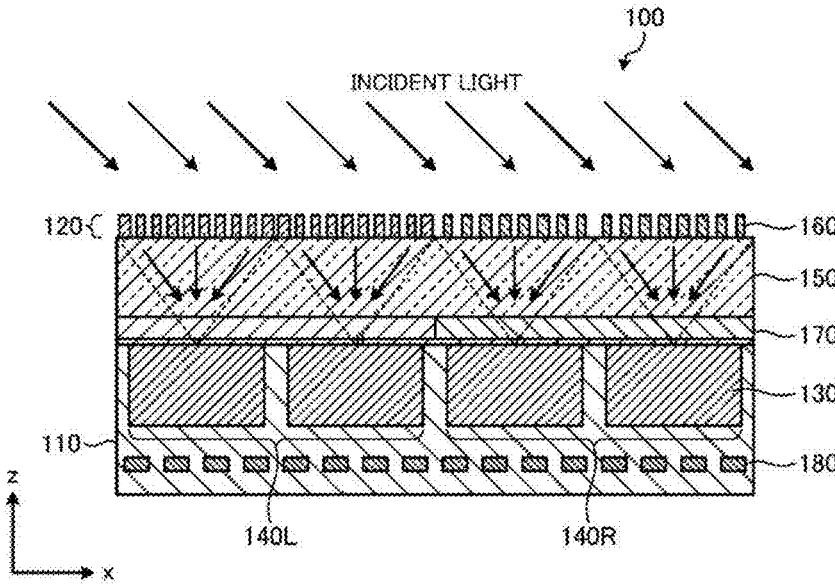
FIG. 4 is a diagram schematically showing a part of a cross section of a pixel array and an optical element array in an outer circumferential portion of the imaging element according to the embodiment.
Figure 5:
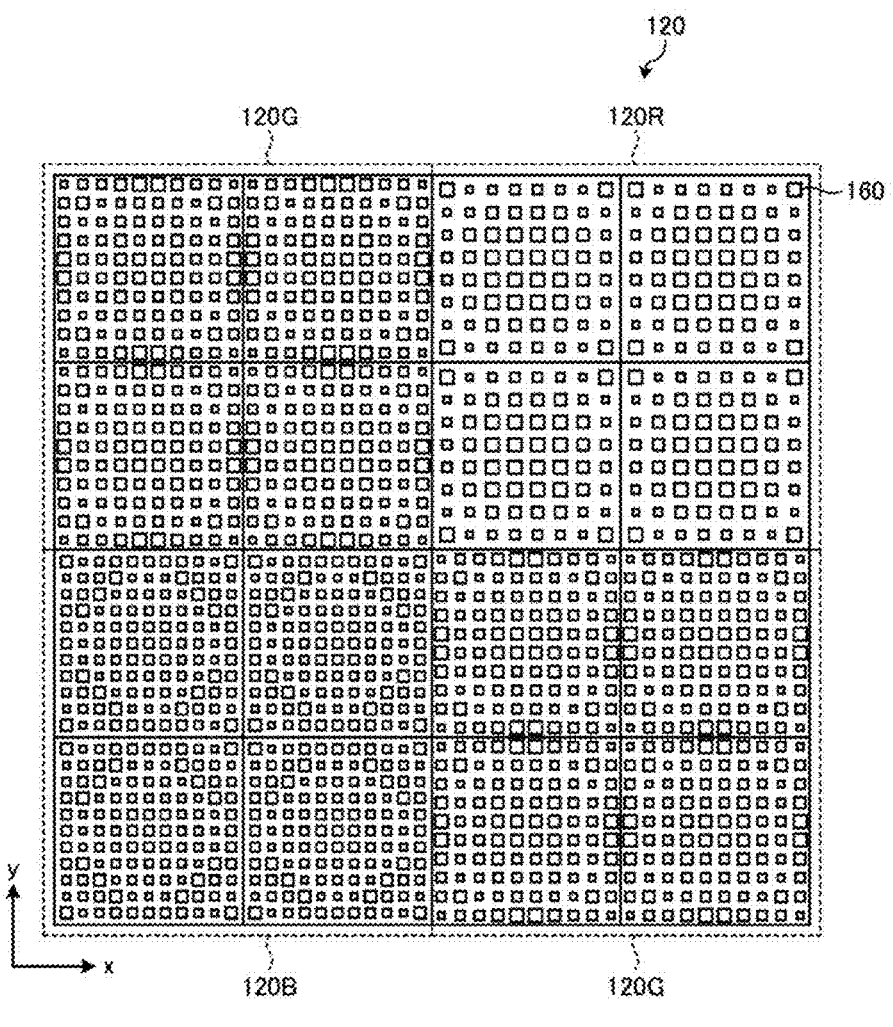
FIG. 5 is a top view of the optical element array in the central portion of the imaging element according to the embodiment.

FIG. 3 is a diagram schematically showing a part of a cross section of a pixel array and an optical element array in a central portion of the imaging element according to the embodiment. FIG. 4 is a diagram schematically showing a part of a cross section of a pixel array and an optical element array in an outer circumferential portion of the imaging element according to the embodiment. FIG. 5 is a top view of the optical element array in the central portion of the imaging element according to the embodiment.

As shown in FIGS. 3 and 4, the imaging element 100 has a pixel array 110 and an optical element array 120 disposed to face a pixel array 110. The optical element array 120 is disposed on a side on which light from the lens optical system 11 is incident. The optical element array 120 is formed on an upper surface of a transparent layer 150 formed on the pixel array 110. A color filter 170 corresponding to each pixel is provided on the pixel array 110. The transparent layer 150 is a transparent layer having a low refractive index made of a material such as $SiO_2$ (refractive index n=1.45).

The pixel array 110 has a wiring layer 180 and pixels 130 including photoelectric conversion elements arranged in a two-dimensional array. For example, the pixels 130 of a pixel unit 140L receive G light and the pixels 130 of a pixel unit 140R receive R light.

In the optical element array 120, optical elements composed of a plurality of columnar structure bodies 160 in which incident light is guided to the photoelectric conversion element of the corresponding pixel 130 directly below the columnar structure body are arranged in a two-dimensional array. For example, FIG. 5 shows a case in which wavelength regions separated by a color filter 170 are red (R), green (G), and blue (B). In the optical element array 120 of FIG. 5, optical element units which include an optical element unit 120R (optical element) corresponding to the R pixel unit, two optical element units 120G (optical element) corresponding to the G pixel unit, and an optical element unit 120B (optical element) corresponding to the B pixel unit as one set which are disposed so that the R pixel unit configured to receive R light, the two G pixel units configured to receive G light, and the B pixel unit configured to receive B light are located directly below the pixel array 110 are formed in a two-dimensional array.

The plurality of columnar structure bodies 160 are formed by using a material having a refractive index higher than that of the surrounding material (transparent layer 150, air). Thus, the columnar structure body 160 strongly traps light inside the columnar structure body and prevents optical coupling with the adjacent columnar structure body. The columnar structure body 160 is formed by using, for example, SiN (refractive index n=2.05) and $TiO_2$ (refractive index n=2.4).

As shown in FIGS. 3 and 4, the plurality of columnar structure bodies 160 are formed at the same height when viewed in a side view. The plurality of columnar structure bodies 160 are formed on the entire surface of the optical element array 120 at intervals shorter than the wavelength of the incident light. As shown in FIG. 5, in the optical element units 120R, 120G, and 120B, the plurality of columnar structure bodies 160 are formed in a grid pattern when viewed in a plan view. The plurality of columnar structure bodies 160 are prisms. Note that the example of FIG. 5 is an example and the columnar structure body may adopt a structure body which is subject to four rotations such as a hollow square, a circle, a hollow circle, or a cross when viewed in a plan view.

The plurality of columnar structure bodies 160 are each formed in a width w having a phase characteristic for guiding incident light to the photoelectric conversion element of the corresponding pixel 130 directly below the columnar structure body in accordance with the incident angle of the incident light of each columnar structure body when viewed in a plan view. Each of the plurality of columnar structure bodies 160 provides an amount of optical phase delay according to the width of the columnar structure body 160 to the incident light when viewed in a plan view.

In the optical element units 120R, 120G, and 120B, each of the plurality of columnar structure bodies 160 constituting the optical element unit 120R, 120G, and 120B has a width in which an optical phase delay amount distribution for guiding incident light to each photoelectric conversion element of the corresponding R pixel unit, G pixel unit, and B pixel unit is provided. In the optical element units 120R, 120G, and 120B, a width of each of the plurality of columnar structure bodies 160 forming the optical element units 120R, 120G, and 120B when viewed in a plan view is set to a width in which an optical phase delay amount distribution for guiding incident light to the photoelectric conversion element directly below the optical element units 120R, 120G, and 120B in accordance with the incident angle of the incident light is provided. Note that the optical phase delay amount distribution is an optical phase delay amount for condensing light.

The imaging element 100 realizes a lens function by forming a columnar structure body 160 having the same height and gradually changing the width on the entire surface of the optical element array 120. Since each columnar structure body 160 behaves like a columnar optical waveguide, in the imaging element 100, the effective refractive index of the columnar structure body 160 can be changed by changing the width of the columnar structure body 160 and a phase of the transmitted light can be freely controlled.

In other words, each columnar structure body 160 behaves as an optical waveguide of a sub-wavelength size and there is almost no optical coupling with an adjacent columnar structure body 160 due to light confinement. Thus, it is possible to provide different optical characteristics (for example, phase delay characteristics) to each of the plurality of columnar structure bodies 160 by designing a width w of the columnar structure body 160 in a plan view for each columnar structure body 160. The lens function can be imparted to the columnar structure body 160 by making the spatial distribution of the phase delay amount equivalent to that of a (Fresnel) lens.

Here, NPL 1 describes that a structure body made of a low refraction material such as $SiO_2$ is made to function as a lens.

NPL 1 describes an approximation in which, when the structure body is very small compared to the wavelength, the effective refractive index of the structure body can be expressed by an approximately average value between the refractive index of the structural lens and the refractive index of the surrounding material. However, when a large difference between a refractive index of the structure body and a refractive index of the surroundings is provided and a size of the structure body is about the sub-wavelength, light is confined inside the structure and excites an optical waveguide mode and a resonance mode. Thus, this approximation is no longer applicable. Therefore, the structure body described in NPL 1 is limited to a combination of materials having a small difference in refractive index, in which the material is $SiO_2$ and the surrounding material is air or the like. Thus, an aspect ratio of the structure body increases.

On the other hand, in the imaging element 100, each columnar structure body 160 is formed by using a high refractive index material such as SiN or $TiO_2$. Therefore, a height of the minimum columnar structure body 160 required for realizing a phase change amount of 0 to 2n is lower than that of the structure body made of a low refraction material such as $SiO_2$ (refer to NPL 1). Therefore, the imaging element 100 can realize a lens function with the columnar structure body 160 having a low aspect ratio, which has a relatively small minimum structure height required for phase control of 0 to $2\pi$ and is easy to manufacture.

Also, the plurality of columnar structure bodies 160 are prisms having a square bottom surface. As described above, in the imaging element 100, each columnar structure body 160 has a four-fold rotationally symmetric structure such as a square when viewed in a plan view so that the characteristics are independent of polarization. Note that it is clear that the structure body described in NPL 1 has a polarization dependence on the effective refractive index based on a theoretical expression.

Furthermore, NPL 1 describes a structure body having a curved surface and a step. On the other hand, each columnar structure body 160 in the embodiment is a square columnar binary pattern without a step. Therefore, the imaging element 100 can exclude a curved surface and a step from the cross section of the columnar structure body. Thus, the columnar structure body 160 is relatively easy to prepare compared with the structure body described in NPL 1.

Furthermore, the imaging element 100 realizes a lens function by forming a plurality of columnar structure bodies 160 on the entire surface of the optical element array 120. Thus, all incident light can be received and a lens aperture can be maximized.

Furthermore, each columnar structure body 160 is formed in a width w having a phase characteristic which leads light to a photoelectric conversion element of the pixel 130 directly below the columnar structure body 160 in accordance with the incident angle of the incident light of each columnar structure body 160 when viewed in a plan view. That is to say, it is possible to optimize a structural pattern of the columnar structure body 160 for each pixel to improve the light receiving efficiency in accordance with the main incident angle in the imaging element 100. In other words, the shape pattern of the columnar structure body 160 when viewed in a plan view is optimized in accordance with the incident angle $\theta$ of the light incident on each columnar structure body 160 in the imaging element 100.

Thus, in the imaging element 100, the columnar structure body 160 can be focused on the photoelectric conversion element of the pixel 130 directly below the columnar structure body also in both the outer circumferential portion on which light is incident at a large incident angle $\theta$ (refer to FIG. 4) and the central portion on which light is vertically incident (refer to FIG. 3). Therefore, the imaging element 100 can focus a large amount of light on the photoelectric conversion element directly below the imaging element and can generate an image signal having uniform brightness in the entire imaging element 100.

[Height of Columnar Structure Body] The height of the columnar structure body 160 when viewed in a side view will be described below. Hereinafter, the height of the columnar structure body 160 when viewed in a side view is referred to as the height of the columnar structure body 160. Also, the width of the columnar structure body 160 when viewed in a plan view is referred to as the width of the columnar structure body 160. Here, a minimum height of the columnar structure body 160 required for phase control of 0 to $2\pi$ will be described.

The phase delay amount $\varphi$ due to the columnar structure body 160 is represented by Expression (1), assuming that the wavelength of light in a vacuum is $\lambda$, the height of the columnar structure body 160 is h, the effective refractive index of the columnar structure body 160 is $n_{eff}$, and the refractive index of the surrounding material is $n_0$.

[Math. 1]

$$\varphi = (n_{eff} - n_0) \times 2\pi h / \lambda \tag{1}$$

Expression (1) is applied to both the columnar structure body 160 in the imaging element 100 and the structure body described in NPL 1 (hereinafter referred to as an effective medium approximate structure body).

In the case of the effective medium approximation structure body, it is known that the effective refractive index $n_{eff}$ is determined by an area ratio between the structure body and the surrounding material. In the case of the effective medium approximation structure, a value of $n_{eff}$ also fluctuates depending on the polarization. In the case of the columnar structure body 160, the optical waveguide mode largely depends on the width of the columnar structure body 160. Thus, it is known that the effective refractive index $n_{eff}$ is expressed by a function of the width w of the columnar structure body 160. In either case of the effective medium approximation structure body or the columnar structure body 160, a value of $n_0 < n_{eff} < n_1$ is taken. Note that $n_1$ is the refractive index of the material constituting the structure body.

Therefore, in order to control an amount of phase change between 0 and $2\pi$, the height of the structure body needs to be set to Expression (2).

[Math. 2]

$$h \geq \lambda_0 / (n_1 - n_0) \tag{2}$$

FIG. 6 is a diagram showing a minimum structural height and a maximum aspect ratio of a medium-sized approximate structure in the related art and the columnar structure body 160 in the embodiment. In FIG. 6, the maximum aspect ratio is obtained with the minimum structural width as 100 nm when a wavelength of light is 635 nm.

In order to apply the effective medium approximation, it is necessary to reduce $n_1 - n_0$. Therefore, in the case of an effective medium approximation structure body, the required height of the structure body is necessarily as high as 1411 nm as shown in FIG. 6 and several wavelengths are required.

On the other hand, in the case of the columnar structure body 160, the larger $n_1$ is preferable from the viewpoint of light confinement so that the value of $n_1 - n_0$ is larger than that of the effective medium approximation structure body. For example, the materials forming the columnar structure body 160 are SiN (n=2.05) and $TiO_2$ (n=2.4), and $n_1 - n_0 \geq 0.7$.

As a result, in the columnar structure body 160, the required structural height is relatively lower than that of the effective medium approximation structure body, and as shown in FIG. 6, it is generally one wavelength or less. Thus, the aspect ratio of the columnar structure body 160 is lower than that of the effective medium approximation structure body.

Figure 7:
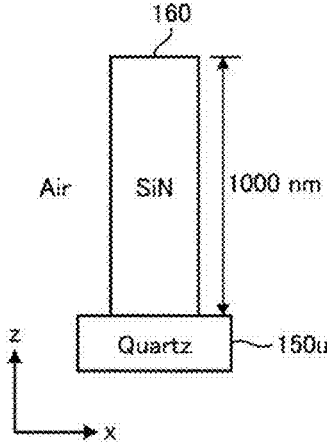
FIG. 7 is a side view of the columnar structure body.
Figure 8:
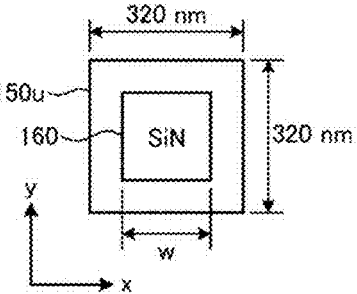
FIG. 8 is a plan view of the columnar structure body.

[Structure of Columnar Structure Body] An example of the structure of the columnar structure body 160 will be described. FIG. 7 is a side view of the columnar structure body 160. FIG. 8 is a plan view of the columnar structure body 160. As shown in FIGS. 7 and 8, for example, the columnar structure body 160 is formed on an upper surface of a transparent layer 150*u* formed of quartz. Furthermore, the height (length in a z axis direction) of the columnar structure body 160 is h=1000 nm and a disposition period of the columnar structure body 160 is 320 nm. The width w of the columnar structure body 160 is set in correspondence with a phase to be controlled of 0 to $2\pi$.

Figure 9:
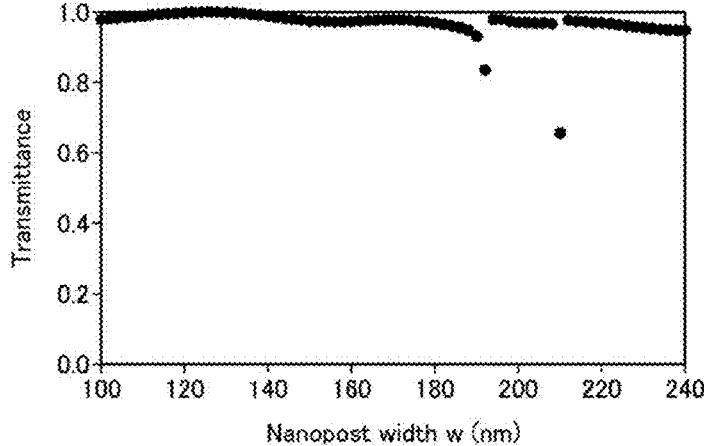
FIG. 9 is a diagram showing a relationship between a width of the columnar structure body and light transmittance.
Figure 10:
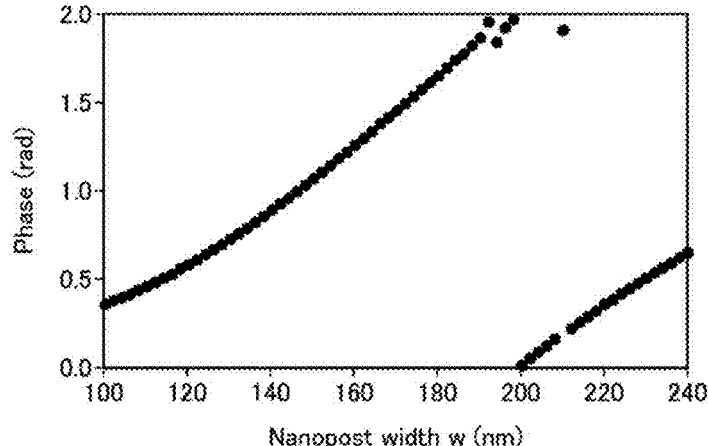
FIG. 10 is a diagram showing a relationship between the width of the columnar structure body and phase characteristics of light of the columnar structure body.

FIG. 9 is a diagram showing a relationship between the width w of the columnar structure body 160 and light transmittance. FIG. 10 is a diagram showing a relationship between the width w of the columnar structure body 160 and phase characteristics of light of the columnar structure body 160.

As shown in FIG. 9, high transmittance can be maintained even when the width w of the columnar structure body 160 is changed between 100 and 240 nm. Furthermore, the phase of the light transmitted through the columnar structure body 160 can be controlled to a desired phase between 0 and 2n by adjusting the width w of the columnar structure body 160 between 100 and 240 nm. Note that, in FIGS. 9 and 10, the maximum aspect ratio of the columnar structure body 160 can be minimized to 10 even when the width of the columnar structure body 160 is reduced to 100 nm.

[Design of Lens] In the imaging element 100 according to the embodiment, the phase distribution of the columnar structure body 160 which functions as a lens is designed to focus on the central portion of the pixel 130 below the optical element array 120 in correspondence with the incident angle.

Furthermore, the imaging element 100 realizes an ideal phase distribution of a design target by setting the width w of the columnar structure body 160 for each columnar structure body 160 with reference to the phase characteristic of FIG. 10 to have a designed phase distribution.

For example, parameters of a design example are shown below:

Size of one photoelectric conversion element=lens area: 3.2 $\mu$m×3.2 $\mu$m

Focal length: 3.2 $\mu$m

Design wavelength: 520 nm.

Figure 11:
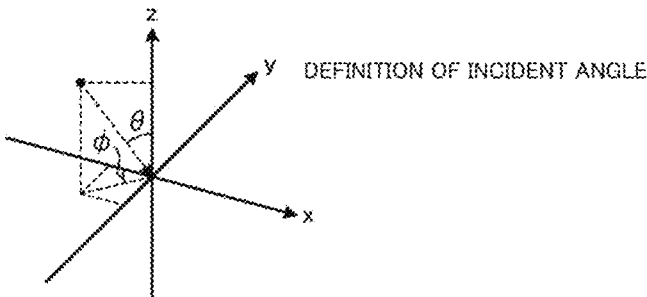
FIG. 11 is a diagram for describing a definition of an incident angle.

FIG. 11 is a diagram for describing a definition of an incident angle. As shown in FIG. 11, a case in which light is incident at an incident angle of ($\theta$, $\varphi$) will be described. A phase distribution $\varphi$ of a lens which focuses light at a certain incident angle ($\theta$, $\varphi$) at a point directly below a center of the lens (columnar structure body 160) at a focal length f is expressed by the following Expression (3).

[Math. 3]

$$\varphi(x, y) = -\frac{2\pi}{\lambda_d}\left\{n_{in}(x\cos\phi + y\sin\phi)\sin\theta + n_{out}\left(\sqrt{x^2 + y^2 + f^2} - f\right)\right\} + C \quad (3)$$

In Expression (3), $\lambda_d$ is a design wavelength, f is a focal length, $n_{in}$ is a refractive index of a material on an incident side, $n_{out}$ is a refractive index of a material on an exit side, and C is an arbitrary constant.

For example, f=3.2 $\mu$m, $n_{in}$=1.0 (air), $n_{out}$=1.445 (quartz glass). $\varphi$ is converted so that it falls within the range of 0 to $2\pi$. For example, when $\varphi$ is $-0.5\pi$, it is converted to $1.5\pi$, and when $\varphi$ is $2.5\pi$, it is converted to 0.5. In this setting, the phase distribution of the design target of the lens when light is incident at an arbitrary incident angle and the lens (columnar structure body 160) pattern capable of realizing the phase distribution will be described with reference to FIGS. 12 to 14. The phase distribution of the design target of the lens is the phase distribution of the lens focused on the light at a certain incident angle at the point directly below a center of the lens at a focal length f.

Figure 12:
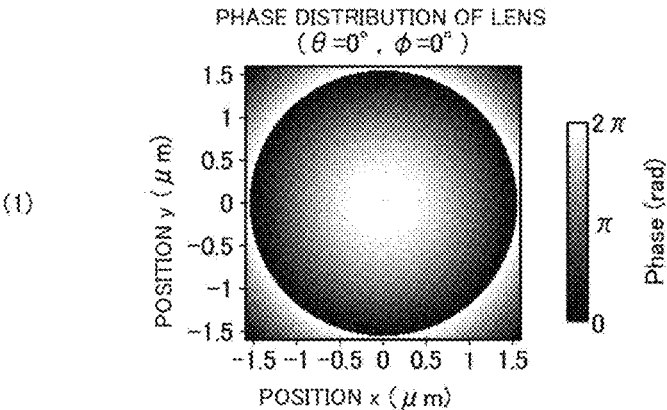
FIG. 12 is a diagram showing a phase distribution of a lens design target when light is incident at an incident angle of θ=0° and φ=0° and a lens pattern in which the phase distribution is realized.
Figure 12:
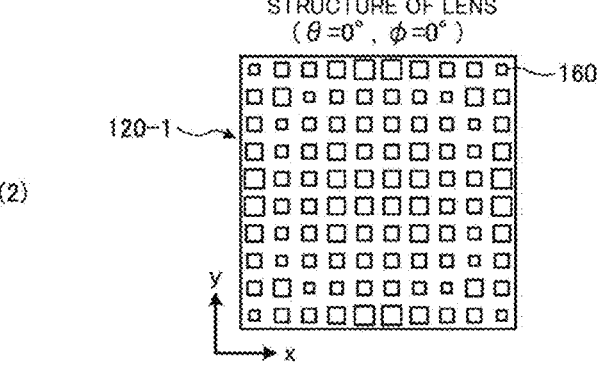
Figure 13:
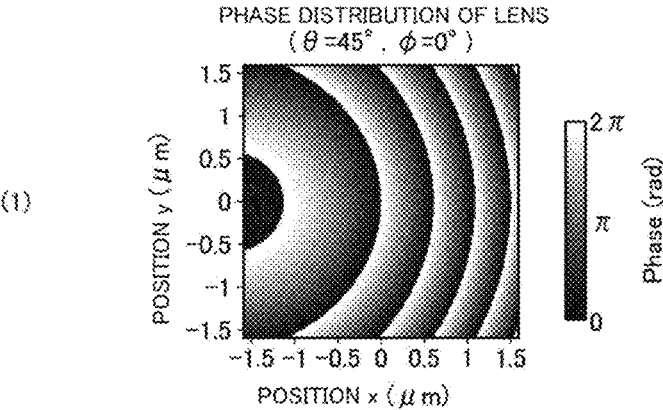
FIG. 13 is a diagram showing a phase distribution of a lens design target when light is incident at an incident angle of θ=45° and φ=0° and a lens pattern in which the phase distribution is realized.
Figure 13:
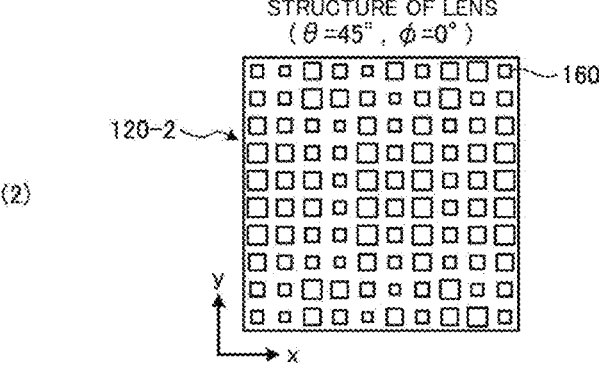
Figure 14:
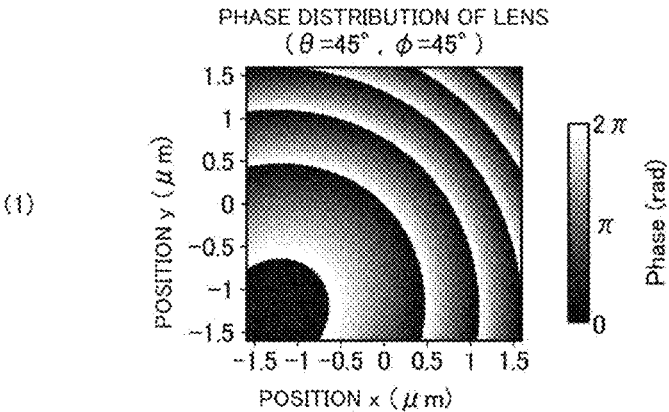
FIG. 14 is a diagram showing a phase distribution of a lens design target when light is incident at an incident angle of θ=45° and φ=45° and a lens pattern in which the phase distribution is realized.
Figure 14:
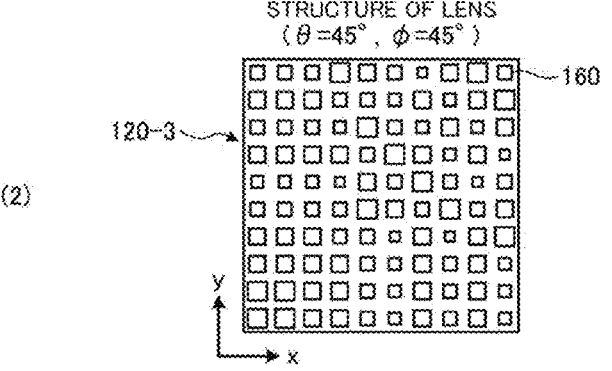

FIG. 12 is a diagram showing a phase distribution of a lens design target when light is incident at an incident angle of $\theta$=0° and $\varphi$=0° and a lens (columnar structure body 160) pattern that realizes the phase distribution. FIG. 13 is a diagram showing a phase distribution of a lens design target when light is incident at an incident angle of $\theta$=45° and $\varphi$=0° and a lens pattern that realizes the phase distribution. FIG. 14 is a diagram showing a phase distribution of a lens design target when light is incident at an incident angle of $\theta$=45° and $\varphi$=45° and a lens pattern that realizes the phase distribution. (1) of FIG. 12, (1) of FIG. 13, and (1) of FIG. 14 are phase distributions of the design target of the lens when light is incident at the incident angle of each condition. (2) of FIG. 12, (2) of FIG. 13, and (2) of FIG. 14 are a plan view of the columnar structure body 160 capable of realizing the phase distributions of (1) of FIG. 12, (1) of FIG. 13, and (1) of FIG. 14, respectively. It is a plan view of the columnar structure body 160 and is the shape pattern of the columnar structure body 160 designed per pixel.

As shown in (2) of FIG. 12, (2) of FIG. 13, and (2) of FIG. 14, the columnar structure body 160 is a prism having a square bottom surface. The width w of the columnar structure body 160 is set to have a width in which the phase at the corresponding position among the phase distributions of (1) in FIG. 12, (1) in FIG. 13, and (1) in FIG. 14 can be realized on the basis of a relationship between the width w of the columnar structure body 160 and the light phase characteristics of the columnar structure body 160 shown in FIG. 10.

For example, an optical element unit 120-1 shown in (2) of FIG. 12 has a shape pattern of a columnar structure body 160 in which a phase distribution of a lens design target when light is incident at an incident angle of $\theta$=0° and $\varphi$=0° is realized. An optical element unit 120-2 shown in (2) of FIG. 13 has a shape pattern of a columnar structure body 160 in which a phase distribution of a lens design target when light is incident at an incident angle of $\theta$=45° and $\varphi$=0° is realized. An optical element unit 120-3 shown in (2) of FIG. 14 has a shape pattern of a columnar structure body 160 in which a phase distribution of a lens design target when light is incident at an incident angle of $\theta$=45° and $\varphi$=45° is realized.

[Wavelength Dependence of Light-Collection Intensity] In the embodiment, the pattern of each columnar structure body 160 of the optical element units 120R, 120G, and 120B is designed in correspondence with the design wavelength of the photoelectric conversion element of the corresponding pixel unit directly below the columnar structure body, as in the optical element units 120R, 120G, and 120B shown in FIG. 5. In the optical element unit, the width w of each of the plurality of columnar structure bodies 160 forming the optical element unit when viewed in a plan view is set to have a width in which an optical phase delay amount distribution for guiding light in the wavelength range received by the photoelectric conversion element corresponding to the optical element unit to the photoelectric conversion element corresponding to the optical element unit is provided. Therefore, the wavelength dependence of the light-collection intensity by the optical element array 120 will be described.

Figure 15:
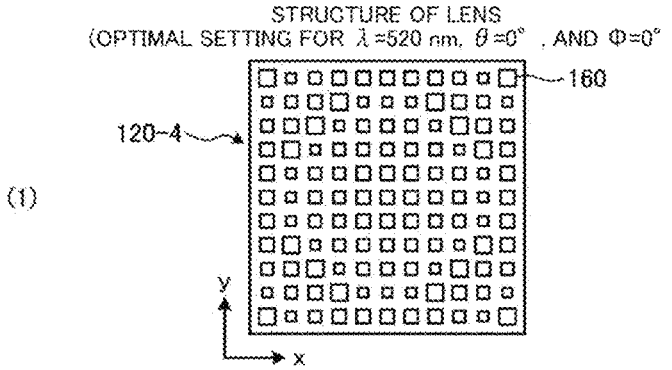
FIG. 15 is a diagram showing a light-collection intensity of an optical element unit and a wavelength dependence thereof.
Figure 15:
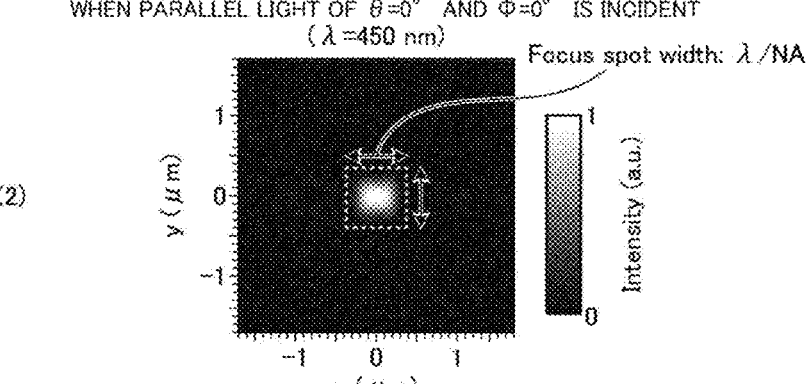
Figure 15:
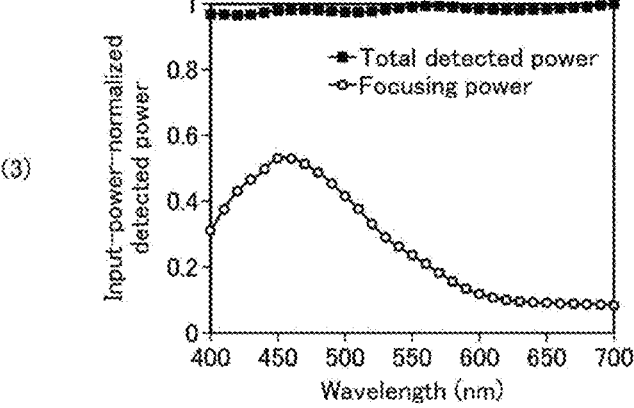
Figure 16:
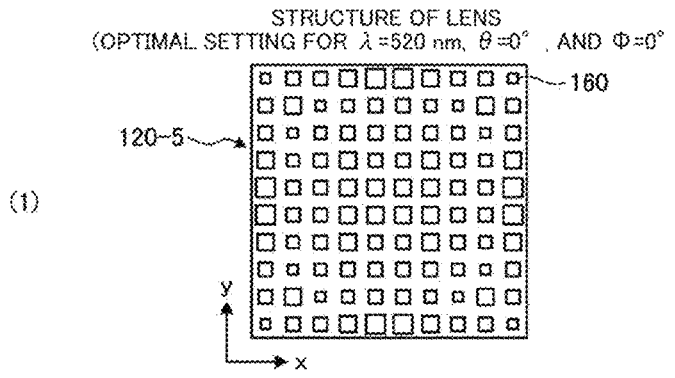
FIG. 16 is a diagram showing a light-collection intensity of the optical element unit and a wavelength dependence thereof.
Figure 16:
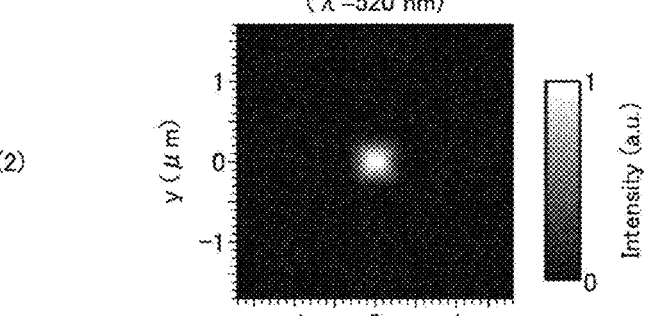
Figure 16:
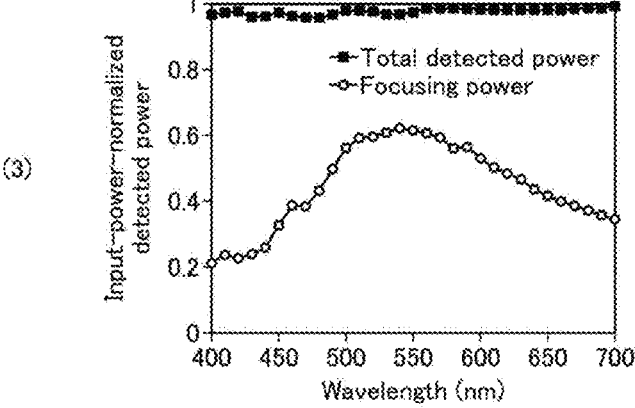
Figure 17:
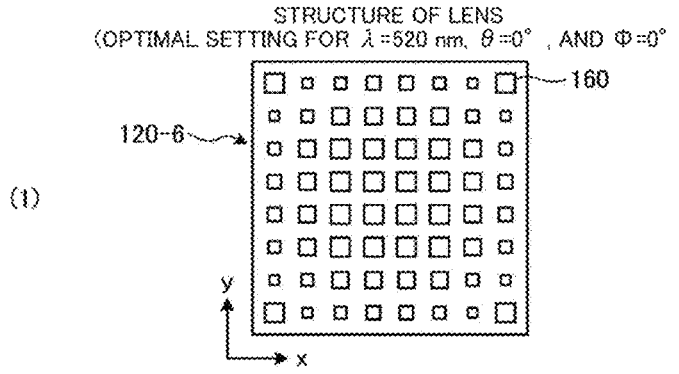
FIG. 17 is a diagram showing a light-collection intensity of the optical element unit and a wavelength dependence thereof.
Figure 17:
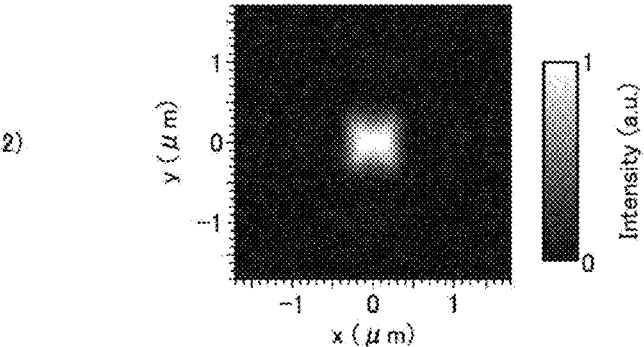
Figure 17:
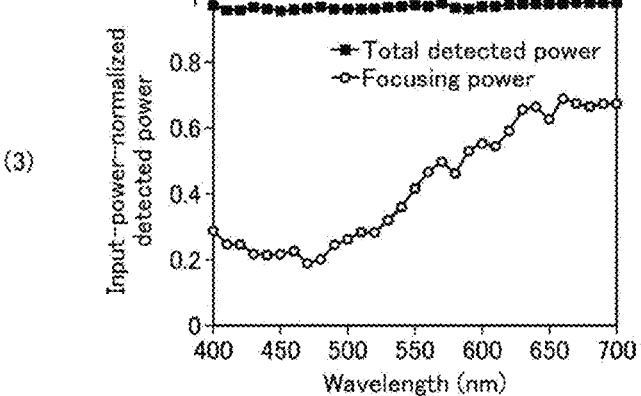

FIGS. 15 to 17 are diagrams showing a light-collection intensity of the optical element unit and a wavelength dependence thereof. FIG. 15 corresponds to B light having a wavelength $\lambda=450$ nm, FIG. 16 corresponds to G light having a wavelength $\lambda=520$ nm, and FIG. 17 corresponds to R light having a wavelength $\lambda=635$ nm.

(1) of FIG. 15, (1) of FIG. 16, and (1) of FIG. 17 are patterns of a lens (columnar structure body 160) optimally designed for vertically incident light ($\theta=0°$, $\varphi=0°$) and an average of both polarization is taken. (2) of FIG. 15, (2) of FIG. 16, and (2) of FIG. 17 show light-collection intensities using optical element units 120-4, 120-5, and 120-6 of (1) of FIG. 15, (1) of FIG. 16, and (1) of FIG. 17. Each of the light-collection intensities is the total intensity within a light-collecting spot width on the surface of the photoelectric conversion element of the pixel 130 (A/NA and NA are numerical apertures of the lens). (3) of 15, (3) of 16, and (3) of 17 are diagrams showing the wavelength dependence of the light-collection intensities by the optical element units 120-4, 120-5, and 120-6.

It can be seen that 96% or more of the light can pass through the structure and be received by the pixel 130 in all of the optical element units 120-4, 120-5, 120-6, as shown in (3) of FIG. 15, (3) of FIG. 16, and (3) of FIG. 17, Furthermore, the light-collection intensities of the optical element units 120-4, 120-5, and 120-6 show the maximum light-collection intensity around the design wavelength.

Therefore, in the imaging element 100, It is possible to design the light collection according to each design wavelength by simply changing the pattern of the columnar structure body 160 such as in the optical element units 120-4, 120-5, and 120-6 to correspond to each color band (transmission band of the color filter of R, G, and B). In the imaging element 100, the design wavelength of each pixel 130 may be determined in accordance with the color filter on the pixel 130 and the optical element units 120-4, 120-5, and 120-6 may be integrated in accordance with the design wavelength of the pixel 130 immediately below the optical element unit.

[Design Example of Optical Element Unit Corresponding To Incident Angle] In the embodiment, the pattern of each columnar structure body 160 of the optical element unit is designed in accordance with the incident angle of the incident light. In the optical element unit, the width w of each of the plurality of columnar structure bodies 160 forming the optical element unit when viewed in a plan view is set to have a width in which an optical phase delay amount distribution for guiding the incident light to the photoelectric conversion element directly below the optical element unit in accordance with the incident angle of the incident light is provided. Therefore, a design example of the optical element unit corresponding to the incident angle of the incident light on the optical element array 120 will be described.

Figure 18:
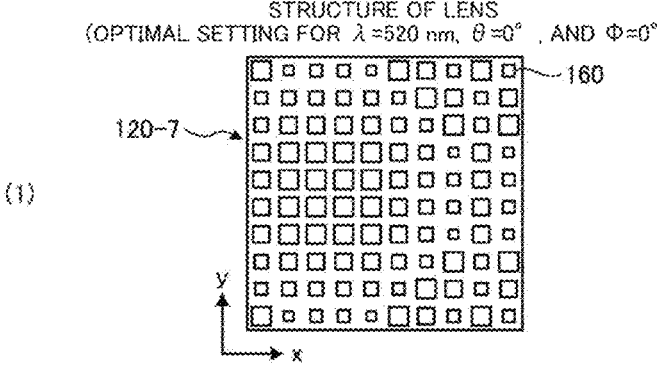
FIG. 18 is a diagram showing a light-collection intensity using the optical element unit and an incident angle dependence of incident light when parallel light (λ=520 nm) of φ=0° is incident.
Figure 18:
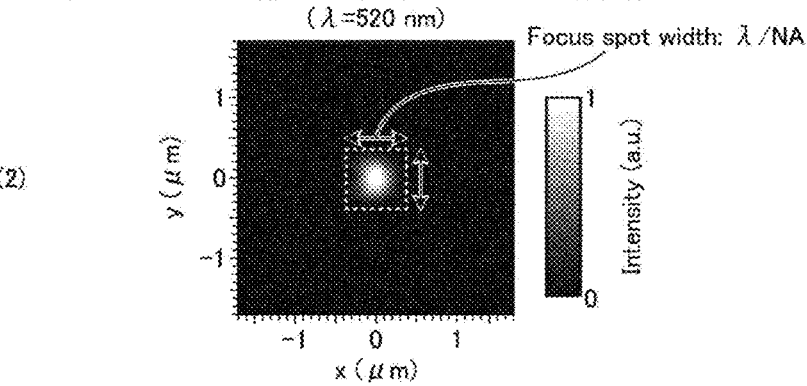
Figure 18:
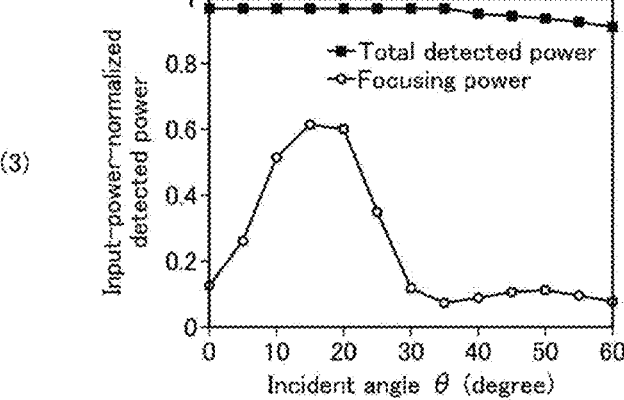
Figure 19:
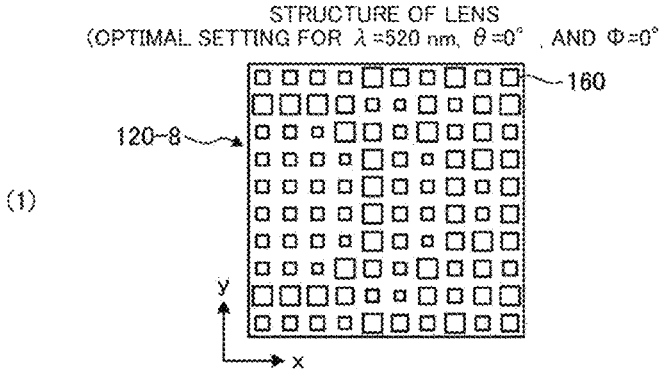
FIG. 19 is a diagram showing a light-collection intensity using the optical element unit and an incident angle dependence of incident light when parallel light (λ=520 nm) of φ=0° is incident.
Figure 19:
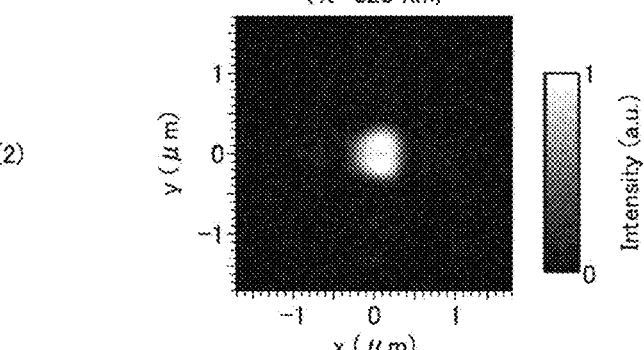
Figure 19:
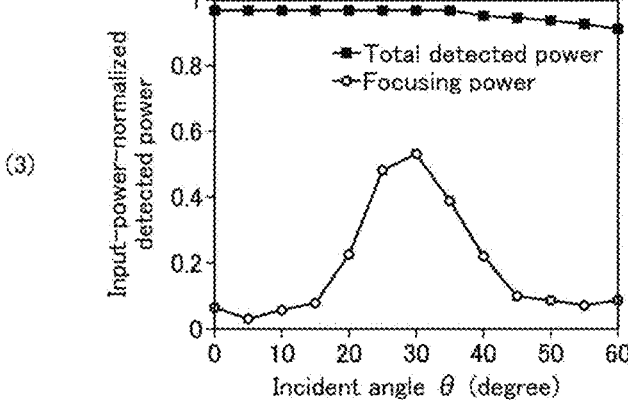
Figure 20:
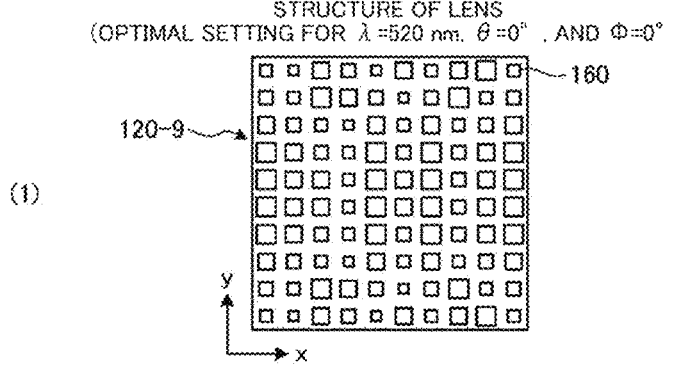
FIG. 20 is a diagram showing a light-collection intensity using the optical element unit and an incident angle dependence of incident light when parallel light (λ=520 nm) of φ=0° is incident.
Figure 20:
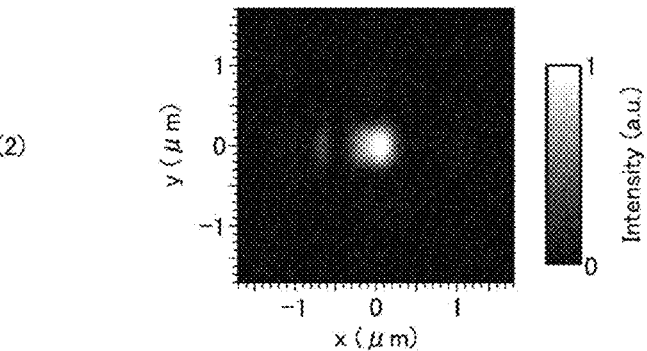
Figure 20:
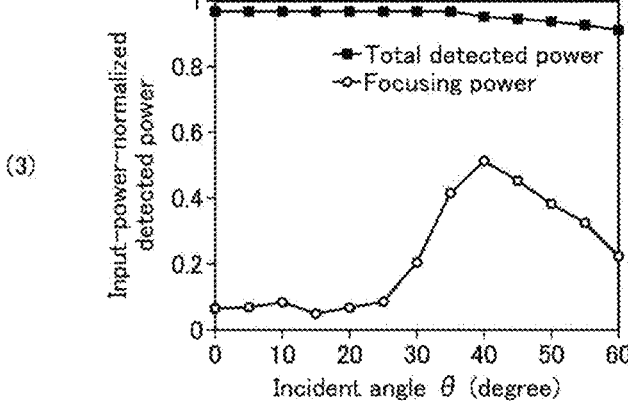

FIGS. 18 to 20 are diagrams showing the light collection intensity by the optical element unit and the incident angle dependence of the incident light when the parallel light ($\lambda=520$ nm) of $\varphi=0°$ is incident. (1) of FIG. 18 is a pattern of the columnar structure body 160 optimally designed for incident light of $\theta=15°$ and $\varphi=0°$, (1) of FIG. 19 is a pattern of the columnar structure body 160 optimally designed for incident light of $\theta=30°$ and $\varphi=0°$, (1) of FIG. 20 is a pattern of the columnar structure body 160 optimally designed for incident light of $\theta=45°$ and $\varphi=0°$, and an average of both polarizations is taken. (2) of FIG. 18, (2) of FIG. 19, (2) of FIG. 20 indicate the light collection intensities using the optical element units 120-7, 120-8, and 120-9 of (1) of FIG. 18, (1) of FIG. 19, and (1) of FIG. 20. (3) of FIG. 18, (3) of FIG. 19, and (3) of FIG. 20 indicate the incident angle dependence of the light collection intensities using the optical element units 120-7, 120-8, and 120-9.

A maximum light collection intensity is shown around the design incident angle in all of the optical element units 120-7, 120-8, and 120-9, as shown in (3) of FIG. 18, (3) of FIG. 19, and (3) of FIG. 20.

Figure 21:
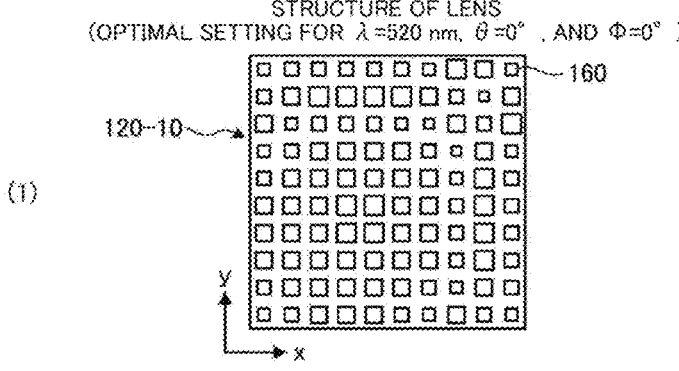
FIG. 21 is a diagram showing a light-collection intensity using the optical element unit and an incident angle dependence of incident light when parallel light (λ=520 nm) of φ=45° is incident.
Figure 21:
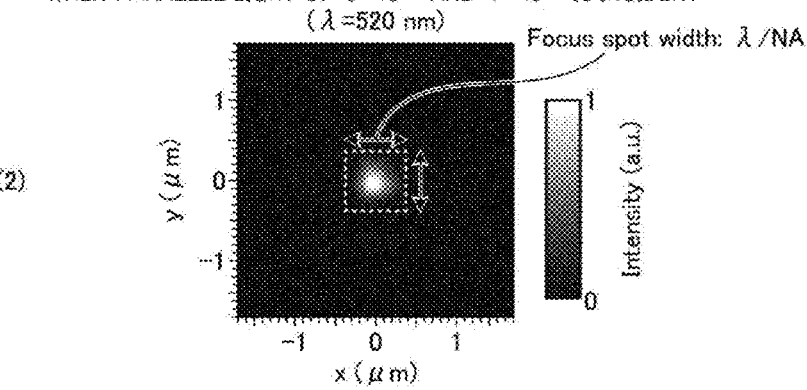
Figure 21:
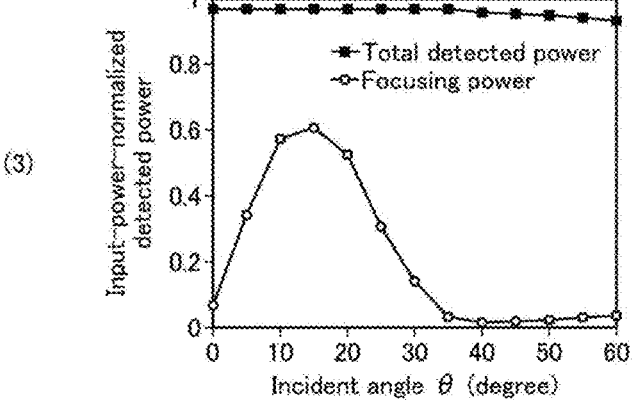
Figure 22:
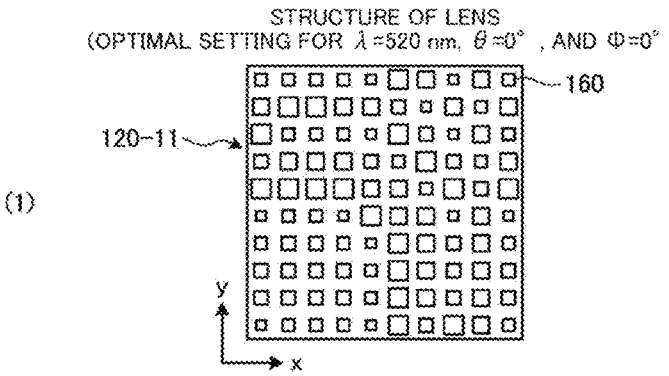
FIG. 22 is a diagram showing a light-collection intensity using the optical element unit and an incident angle dependence of incident light when parallel light (λ=520 nm) of φ=45° is incident.
Figure 22:
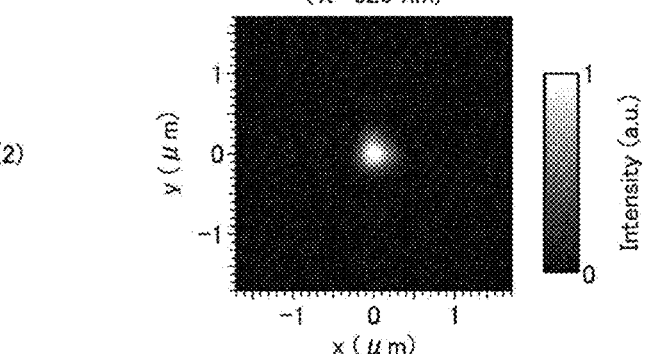
Figure 22:
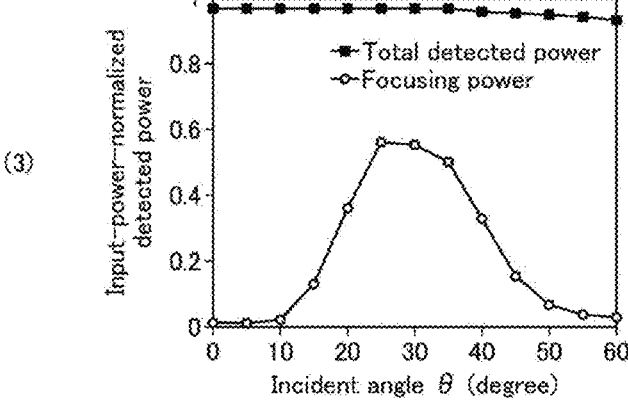
Figure 23:
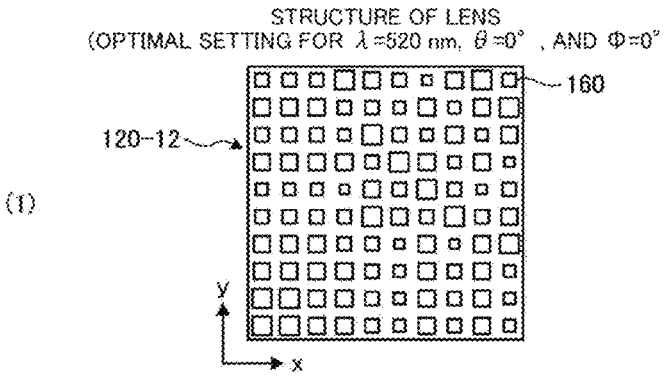
FIG. 23 is a diagram showing a light-collection intensity using the optical element unit and an incident angle dependence of incident light when parallel light (λ=520 nm) of φ=45° is incident.
Figure 23:
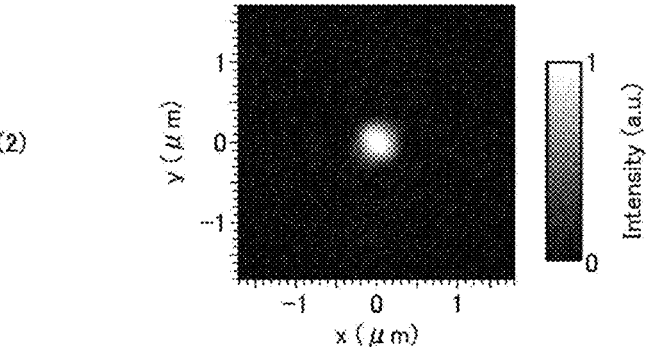
Figure 23:
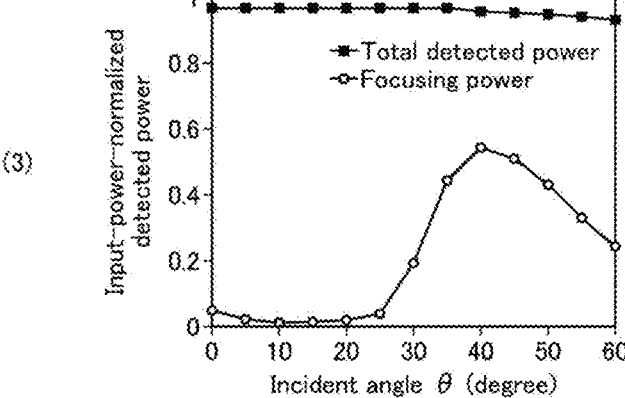

FIGS. 21 to 23 are diagrams showing the light collection intensities by the optical element unit and the incident angle dependence of the incident light when the parallel light ($\lambda=520$ nm) of $\varphi=45°$ is incident. (1) of FIG. 21 is a pattern of the columnar structure body 160 optimally designed for incident light of $\theta=15°$ and $\varphi=45°$, (1) of FIG. 22 is a pattern of the columnar structure body 160 optimally designed for incident light of $\theta=30°$ and $\varphi=45°$, (1) of FIG. 23 is a pattern of the columnar structure body 160 optimally designed for incident light of $\theta=45°$ and $\varphi=45°$, and an average of both polarizations is taken. (2) of FIG. 21, (2) of FIG. 22, and (2) of FIG. 23 are diagrams indicating the light intensities using the optical element units 120-10, 120-11, and 120-12 of (1) of FIG. 21, (1) of FIG. 22, and (1) of FIG. 23. (3) of FIG. 21, (3) of FIG. 22, and (3) of FIG. 23 diagrams indicating the incident angle dependence of the light collection intensities using the optical element units 120-10, 120-11, and 120-12.

A maximum focusing intensity is shown around the design incident angle in all of the optical element units 120-10, 120-11, and 120-12, as shown in (3) of FIG. 21, (3) of FIG. 22, and (3) of FIG. 23.

In the imaging element 100, it is possible to collect light with high intensity on the photoelectric conversion element of the pixel 130 directly below the optical element unit by arranging the above-described optical element units 120-7 to 120-12 in accordance with the incident angle ($\theta$, $\varphi$) of the incident light.

[Effects of Embodiment] Thus, the lens function is realized by forming a plurality of columnar structure bodies 160 on the entire surface of the optical element array 120 at intervals shorter than the wavelength of the incident light in the imaging element 100 according to the embodiment. Thus, all incident light can be received and the light receiving efficiency can be improved.

Furthermore, in the imaging element 100, the plurality of columnar structure bodies are formed in a width in which a phase characteristic for guiding light to the photoelectric conversion element directly below the columnar structure body in accordance with the incident angle of the incident light of each columnar structure body when viewed in a plan view is provided and are formed at the same height when viewed in a side view. The imaging element 100 can generate an image signal having uniform brightness in the entire imaging element 100 because the plurality of columnar structure bodies 160 can realize the lens characteristics corresponding to the incident angle for each pixel 130.

Furthermore, the plurality of columnar structure bodies 160 having a square columnar binary pattern made of a material having a refractive index higher than that of the surrounding material are used as a lens in the imaging element 100. Therefore, the plurality of columnar structure bodies 160 used by the imaging element 100 as lenses have a lower aspect ratio and a simpler configuration than the structure body described in NPL 1 and thus are easily created.

Note that the optical element unit is not limited to the above configuration and may take various forms in terms of number, spacing, structural shape, and arrangement pattern. Furthermore, the columnar structure bodies 160 may be connected to each other or may be embedded in a transparent material.

Figure 24:
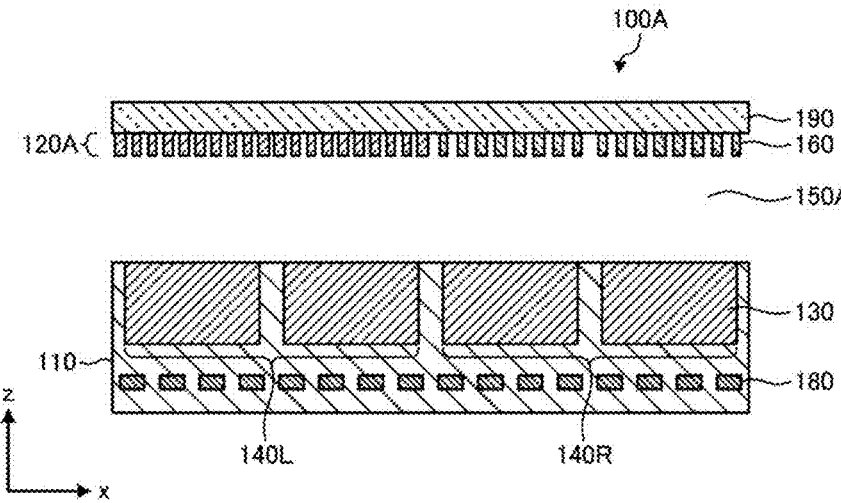
FIG. 24 is a diagram schematically showing another example of a part of a cross section of a pixel array and an optical element array in the imaging element according to the embodiment.

Furthermore, although the optical element array 120 is formed on an upper surface of the transparent layer 150 in FIGS. 3 and 4, the present invention is not limited thereto. FIG. 24 is a diagram schematically showing another example of a part of the cross section of the pixel array and the optical element array in the imaging element according to the embodiment. The optical element array 120A is formed on a bottom surface of an independent transparent substrate 190, as shown in the imaging element 100A of FIG. 24. The plurality of columnar structure bodies 160 may be formed inside the transparent layer 150A (for example, air) as described above.

Furthermore, although an example in which four pixels are located directly below one optical element unit has been described in the above description, the present invention is not limited thereto.

Furthermore, although an example in which SiN and $TiO_2$ are used as the material of the columnar structure body 160 is shown in the embodiment, the present invention is not limited thereto. For example, when the imaging elements 100 and 100A are used in the visible light to near infrared light region in which the wavelength of light is in the range of 380 nm to 1000 nm, materials such as SiN, SiC, $TiO_2$, and GaN are suitable as the material of the columnar structure body 160 because they have a high refractive index and a small absorption loss. Also, materials such as Si, SiC, SiN, $TiO_2$, GaAs, and GaN are suitable as the material of the columnar structure body 160 having low loss with respect to these light when the imaging element 100 or 100A is used in the near-infrared light region having a wavelength in the range of 800 to 1000 nm.

Furthermore, in the near infrared region (communication wavelength of 1.3 μm, 1.55 μm, or the like) in the long wavelength band, InP or the like can be used as the material of the columnar structure body 160 in addition to the above-described materials.

Also, polyimides such as fluorinated polyimides, benzocyclobutene (BCB), photocurable resins, UV epoxy resins, acrylic resins such as PMMA, and polymers such as resists in general can be exemplified as a material when the micro-spectral element of the columnar structure body 160 is formed through pasting and coating.

Similarly, although an example in which $SiO_2$ and an air layer are assumed as the materials of the transparent layers 150 and 150A is shown in the embodiment, the present invention is not limited thereto. The material of the transparent layers 150 and 150A may have a refractive index lower than that of the material of the columnar structure body 160 such as a general glass material, $SiO_2$, and an air layer and may only have to have a low loss with respect to the wavelength of incident light. Furthermore, the transparent layers 150 and 150A may be transparent layers having a laminated structure made of a plurality of materials.

Although a case in which the light in the wavelength range corresponding to the columnar structure body 160 is the light of the three primary colors R, G, and B has been described as an example in the embodiment, at least one of the three wavelength regions may be light having a wavelength other than the three primary colors (for example, infrared light or ultraviolet light).

Furthermore, in the optical element arrays 120 and 120A, the width of at least a part of the plurality of columnar structure bodies 160 when viewed in a plan view is set to have a width in which an optical phase delay amount distribution for guiding incident light to the corresponding photoelectric conversion element directly below the columnar structure body is provided on the basis of the relationship between the width of the columnar structure body 160 illustrated in FIG. 10 and the phase characteristics of light. Thus, in the optical element arrays 120 and 120A, the lens characteristics corresponding to the incident angle and the wavelength range of the photoelectric conversion element are realized for each pixel 130. The present invention is not limited to this, in the embodiment, the plurality of columnar structure bodies 160 may have a refractive index so that they have a phase characteristic for guiding light to the photoelectric conversion element directly below the columnar structure body in accordance with the incident angle of the incident light of each columnar structure body. In other words, in the embodiment, it is possible to realize lens characteristics corresponding to the incident angle and the wavelength range of the photoelectric conversion element for each pixel 130 by setting the plurality of columnar structure bodies 160 to have different refractive indexes from each other. Furthermore, in the embodiment, it is also possible to realize lens characteristics corresponding to the incident angle and the wavelength range of the photoelectric conversion element for each pixel 130 by changing the width of the columnar structure body 160 in a plan view and the refractive index of the columnar structure body value 160 for each columnar structure body.

Furthermore, the optical element arrays 120 and 120A in the embodiment are, for example, metasurfaces. As described above, the metasurface is an element composed of a plurality of fine structures having a width equal to or less than the wavelength of light and may be a two-dimensional structure or a three-dimensional structure. It is possible to control the phase and light intensity in accordance with the characteristics of light (wavelength, polarization, incident angle) by simply changing the parameters of the microstructure by using a metasurface for the optical element. Furthermore, the above-described degree of freedom in design increases when the metasurface has a three-dimensional structure.

Although the present invention has been described above based on a specific embodiment, it is needless to say that the present invention is not limited to the above-described embodiment and can be variously modified without departing from the gist thereof.

REFERENCE SIGNS LIST

1 Object
10 Imaging device
11 Lens optical system
12, 100, 100A Imaging element
13 Signal processing unit
110 Pixel array
120, 120A Optical element array
120R, 120G, 120B, 120-1 to 120-12 Optical element unit
130 Pixel
140L, 140R Pixel unit
150, 150A Transparent layer
160 Columnar structure body
170 Color filter

180 Wiring layer

190 Transparent substrate

The invention claimed is:

1. An imaging element, comprising:

a pixel array in which a plurality of pixels including photoelectric conversion elements are arranged in a two-dimensional array; and an optical element array in which optical elements composed of a plurality of columnar structure bodies arranged opposite to the pixel array and guiding incident light to a corresponding photoelectric conversion element are arranged in a two-dimensional array, wherein the plurality of columnar structure bodies are formed in a width having a phase characteristic for guiding light to a photoelectric conversion element directly below a columnar structure body in accordance with an incident angle of the incident light of each columnar structure body when viewed in a plan view and are formed at a same height when viewed in a side view;

each of the plurality of columnar structure bodies provides an amount of optical phase delay according to the width of the columnar structure body to the incident light when viewed in the plan view, in the optical element, the width of each of the plurality of columnar structure bodies when viewed in the plan view is a width providing an optical phase delay amount distribution for guiding the incident light to the photoelectric conversion element directly below the optical element in accordance with a design wavelength of the photoelectric conversion element directly below the optical element and the incident angle (θ, φ) of the incident light, the θ is an angle between a z-axis as a normal passing through an origin of an x-y plane of the optical element and the incident light incident on the origin of the x-y plane, and the φ is an angle between an x-axis and a shadow produced by the incident light projected onto the x-y plane of the optical element.

2. The imaging element according to claim 1, wherein the plurality of columnar structure bodies are formed of a material having a refractive index higher than that of the material surrounding the plurality of columnar structure bodies and formed in the optical element array at intervals shorter than a wavelength of the incident light.

3. The imaging element according to claim 1, wherein the width of each of the plurality of columnar structure bodies when viewed in a plan view is set to provide an optical phase delay amount distribution for guiding the incident light to the corresponding photoelectric conversion element directly below the columnar structure body in accordance with the incident angle of the incident light for each corresponding photoelectric conversion element directly below the columnar structure body.

4. The imaging element according to claim 1, wherein the width of each of the plurality of columnar structure bodies when viewed in a plan view is set to have a value different for each wavelength range of the photoelectric conversion element directly below the columnar structure body.

5. The imaging element according to claim 1, wherein the optical phase delay amount distribution is an optical phase delay amount for condensing light.

6. The imaging element according to claim 1, wherein the plurality of columnar structure bodies are prisms.

7. The imaging element according to claim 1, further including:

a transparent layer formed on the pixel array, wherein the plurality of columnar structure bodies are formed on an upper portion or an inside of the transparent layer with a material having a refractive index higher than that of the transparent layer.

8. The imaging element according to claim 1, wherein the plurality of columnar structure bodies have a four-fold rotational symmetry structure when viewed in a plan view.

9. An imaging device, comprising:

the imaging element according to claim 1; and a signal processing unit, including one or more processors, configured to process an electric signal output using the imaging element and generate an image.

10. The imaging element according to claim 1, comprising a transparent layer formed between the pixel array and the optical element array, wherein the plurality of columnar structure bodies are formed inside the transparent layer.

11. The imaging element according to claim 10, wherein the transparent layer is air.

12. An imaging element, comprising:

a pixel array in which a plurality of pixels including photoelectric conversion elements are arranged in a two-dimensional array; and an optical element array in which optical elements composed of a plurality of columnar structure bodies arranged opposite to the pixel array and guiding incident light to a corresponding photoelectric conversion element are arranged in a two-dimensional array, wherein the plurality of columnar structure bodies have a refractive index so that they have a phase characteristic for guiding light to the photoelectric conversion element directly below a columnar structure body in accordance with an incident angle of the incident light of each columnar structure body and are formed at a same height when viewed in a side view, each of the plurality of columnar structure bodies provides an amount of optical phase delay according to a width of the columnar structure body to the incident light when viewed in a plan view, in the optical element, the width of each of the plurality of columnar structure bodies when viewed in the plan view is a width providing an optical phase delay amount distribution for guiding the incident light to the photoelectric conversion element directly below the optical element in accordance with a design wavelength of the photoelectric conversion element directly below the optical element and the incident angle (θ, φ) of the incident light, the θ is an angle between a z-axis as a normal passing through an origin of an x-y plane of the optical element and the incident light incident on the origin of the x-y plane, and the φ is an angle between an x-axis and a shadow produced by the incident light projected onto the x-y plane of the optical element.

13. The imaging element according to claim 12, comprising a transparent layer formed between the pixel array and the optical element array, wherein the plurality of columnar structure bodies are formed inside the transparent layer.

14. The imaging element according to claim 13, wherein the transparent layer is air.

15. An imaging device, comprising:

the imaging element according to claim 12; and a signal processing unit, including one or more processors, configured to process an electric signal output using the imaging element and generate an image.

* * * * *